United States Patent
Leano et al.

(10) Patent No.: US 10,340,426 B2
(45) Date of Patent: Jul. 2, 2019

(54) PHOSPHOR AND ILLUMINATION DEVICE UTILIZING THE SAME

(71) Applicant: EPISTAR CORPORATION, Hsinchu (TW)

(72) Inventors: Julius Jr. Liclican Leano, Hsinchu (TW); Ru-Shi Liu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/642,538

(22) Filed: Jul. 6, 2017

(65) Prior Publication Data
US 2019/0013445 A1   Jan. 10, 2019

(51) Int. Cl.
| C09K 11/08 | (2006.01) |
| H01L 33/50 | (2010.01) |
| C09K 11/77 | (2006.01) |

(52) U.S. Cl.
CPC ........ H01L 33/501 (2013.01); C09K 11/7721 (2013.01); H01L 33/507 (2013.01); *C09K 11/0883* (2013.01)

(58) Field of Classification Search
CPC .................................................. H01L 33/501
See application file for complete search history.

(56) References Cited

U.S. PATENT DOCUMENTS

| 7,737,621 B2* | 6/2010 | Masuda | C09K 11/0883 252/301.4 R |
| 2007/0259206 A1* | 11/2007 | Oshio | C04B 35/581 428/690 |
| 2009/0011527 A1* | 1/2009 | Brunner | H01L 33/486 438/26 |
| 2015/0123155 A1 | 5/2015 | Schmidt et al. | |
| 2016/0093776 A1* | 3/2016 | Setlur | C09K 11/617 257/98 |
| 2016/0230086 A1* | 8/2016 | Sato | H01L 33/502 |

OTHER PUBLICATIONS

Julius L Leaño, Jr. et al., "Green Light-Excitable Ce-Doped Nitridomagnesoaluminate Sr[Mg2Al2N4] Phosphor for White Light-Emitting Diodes", Chem. Mater., 28, 2016, pp. 6822-6825.

* cited by examiner

*Primary Examiner* — Eugene Lee
(74) *Attorney, Agent, or Firm* — Muncy, Geissler, Olds & Lowe, P.C.

(57) ABSTRACT

A phosphor is provided, which has a composition of $Sr_{1-x}LiAl_3N_4:Ce^{3+}_x$, wherein $0<x<0.1$. $Sr_{1-x}LiAl_3N_4$ is a host material, and $Ce^{3+}$ is a luminescent center. The phosphor can be collocated with an excitation light source to be applied in an illumination device. On the other hand, the phosphor can be collocated with other phosphors of different colors to be applied in a white light illumination device.

12 Claims, 6 Drawing Sheets

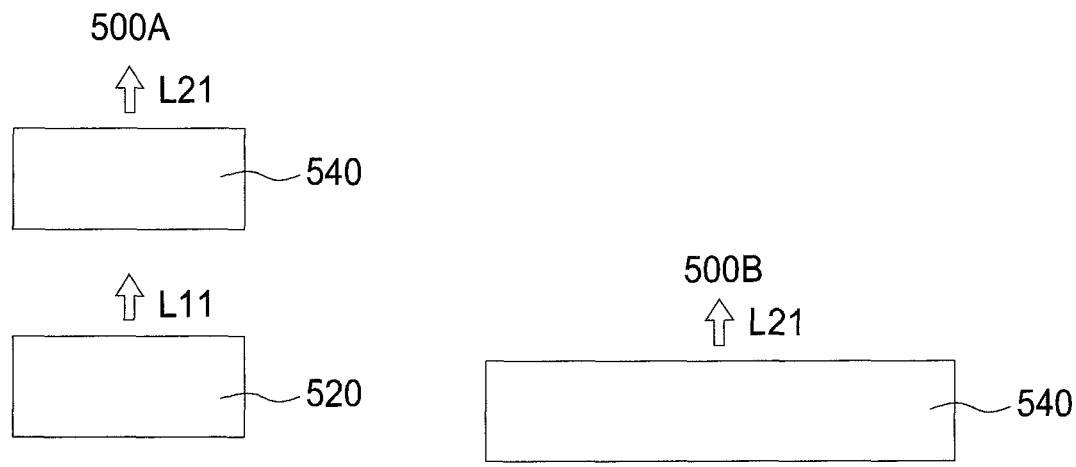
FIG. 5A
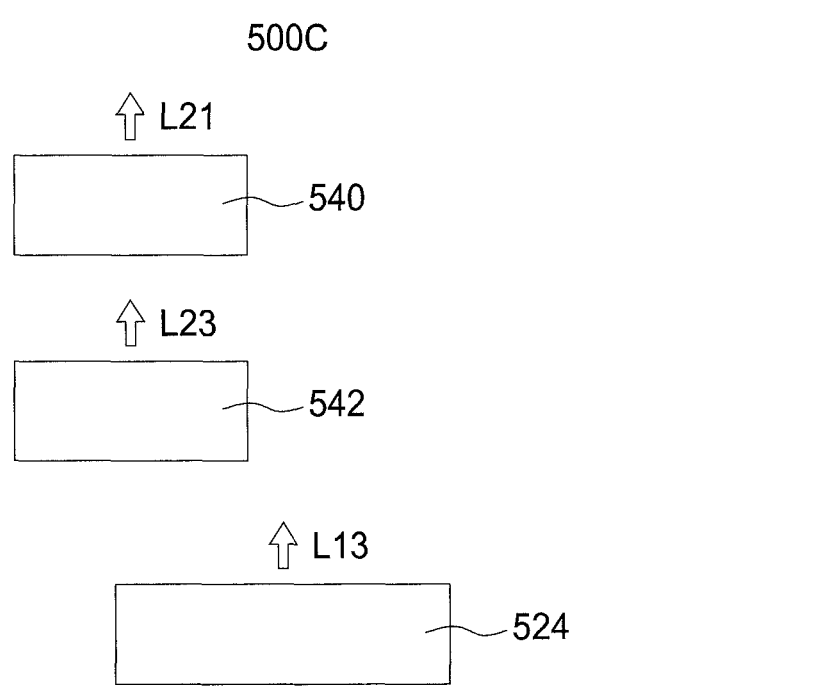
FIG. 5B
FIG. 5C

PHOSPHOR AND ILLUMINATION DEVICE UTILIZING THE SAME

BACKGROUND

Technical Field

The disclosure relates to a phosphor, and in particular it relates to an illumination device utilizing the same.

Description of the Related Art

There are many manufacturing methods for making white light-emitting diodes (WLEDs), such as (1) applying a yellow phosphor onto a blue light-emitting diode (LED) chip, (2) applying a red phosphor and a green phosphor powder to a blue LED chip, (3) mixing a red LED chip, a green LED chip, and a blue LED chip, and (4) applying a blue phosphor, a green phosphor, and a red phosphor (or different phosphor powders of different colors) onto an ultra-violet (UV) LED chip.

The WLED has several advantages over traditional incandescent light bulbs, such as long lifespan, low power consumption, small volume, fast response time, and good shake-resistance. As a result, it has gradually replaced traditional lighting products. However, current WLEDs still need to overcome problems in development, such as heat dissipation, insufficient brightness, and their relatively high price. In the lighting market, WLEDs are mainly used in auxiliary lighting such as flash lights, car interior lights, or decorative architectural lighting products. WLEDs are expected to replace traditional lighting products in the future to enter the mainstream of the global lighting market.

In addition to packaging techniques, the phosphor that is chosen is an important factor in the luminous efficiency of a light source. One of the directions of the research being conducted by photo electronic semiconductor companies and lighting companies is modifying phosphor compositions to increase phosphor conversion efficiency. The color render index of the white light generated by a yellow phosphor powder excited by a traditional single blue chip is not good, as the color saturation of an object illuminated by the white light is poor, thereby lowering its value in the commercial lighting market. Compared with this method, the application of a green phosphor and a red phosphor onto a blue LED may produce a white light with a better color render index. Accordingly, different phosphor compositions for use in a white light illumination device are called for.

BRIEF SUMMARY

One embodiment of the disclosure provides a phosphor having a composition of $Sr_{1-x}LiAl_3N_4:Ce^{3+}_x$, wherein $0<x<0.1$.

One embodiment of the disclosure provides an illumination device including the above phosphor and an excitation light source.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIGS. 5A to 5E show illumination devices in embodiments of the disclosure.

DETAILED DESCRIPTION

Figure 1:
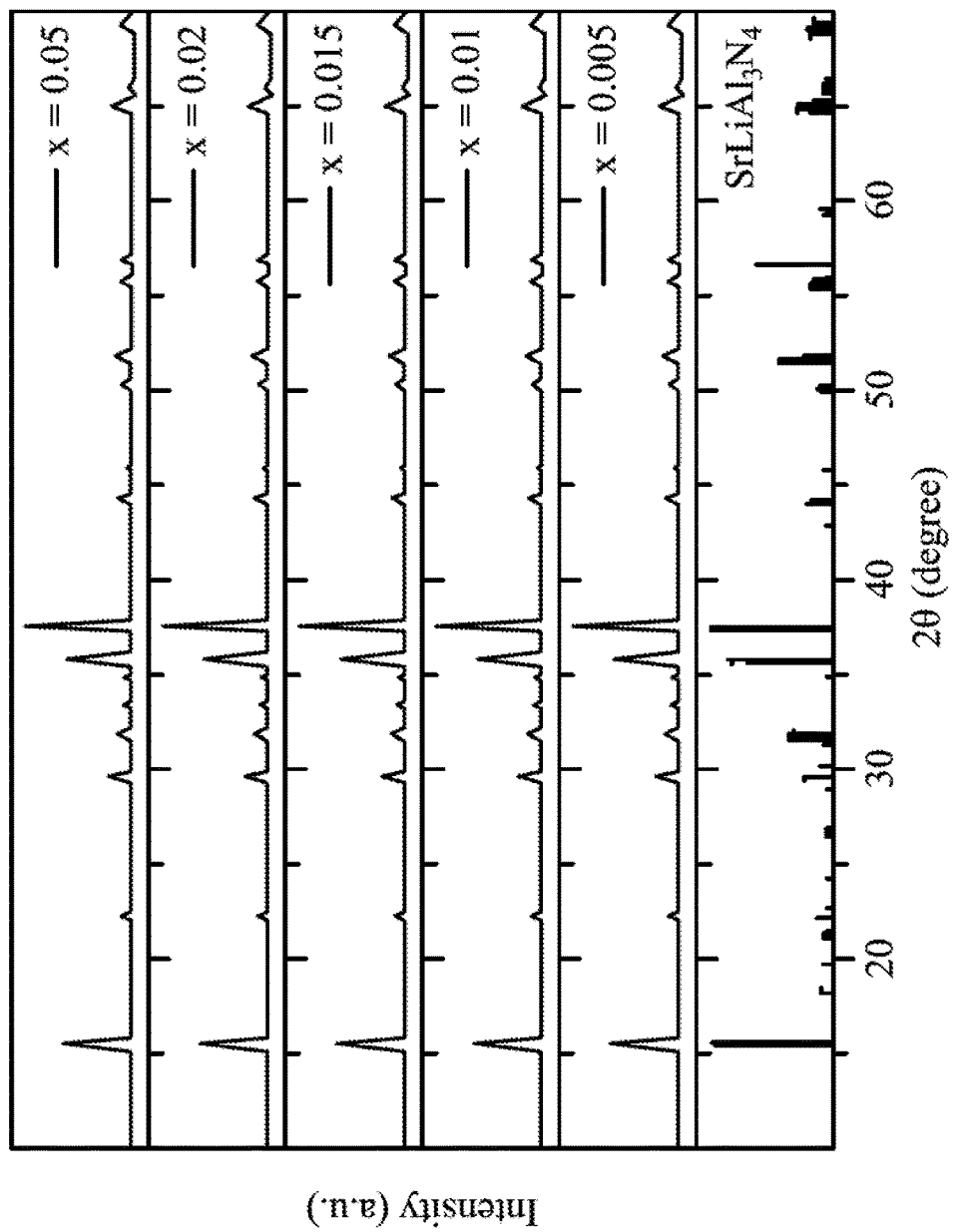
FIG. 1 shows x-ray diffraction spectra of different phosphor powders in embodiments of the disclosure.

The following description is of the best-contemplated mode of carrying out the disclosure. This description is made for the purpose of illustrating the general principles of the disclosure and should not be taken in a limiting sense. The scope of the disclosure is best determined by reference to the appended claims.

In one embodiment of the disclosure, a phosphor is provided, which has a composition of $Sr_{1-x}LiAl_3N_4:Ce^{3+}_x$, in which $0<x<1$. In the above composition, $Sr_{1-x}LiAl_3N_4:Ce^{3+}_x$ is a host material, and $Ce^{3+}$ is a luminescent center. In another embodiment, the composition has an x value of $0.005 \leq x \leq 0.02$. In some embodiments, the composition has an x value of $0.01 \leq x \leq 0.02$. The composition having an overly low x value (e.g. x=0) does not have photoluminescent properties. The phosphor having an overly high x value has insufficient photoluminescent intensity.

The phosphor can be formed by sintering. First, appropriate molar ratios of a strontium resource (e.g. $Sr_3N_2$ or another suitable strontium-containing material), a lithium resource (e.g. $Li_3N$ or another suitable lithium-containing material), an aluminum resource (e.g. AlN or another suitable aluminum-containing material), and a cerium resource (e.g. CeN or another suitable cerium-containing material) are evenly mixed and ground, put into a crucible to be delivered into a high temperature furnace, and then sintered at a temperature of 1000□ to 1200° C. under nitrogen of 0.5 MPa to 0.9 MPa for a period of 3 hours to 10 hours to obtain the phosphor. The phosphor can be ground into a powder for further applications. In one embodiment, the phosphor has an excitation peak of 515 nm to 535 nm, a first emission peak of 560 nm to 580 nm, and a second emission peak of 610 nm to 630 nm. In short, the phosphor has double emission peaks, which may efficiently enhance the color render index of a white light illumination device utilizing the same. On the other hand, the phosphor (e.g. $Sr_{1-x}LiAl_3N_4:Ce^{3+}_x$ with an x value of $0.01 \leq x \leq 0.02$) at high temperature (e.g. 300° C.) has a relative emission intensity of greater than about 80% (on the basis of emission intensity of the phosphor at 25° C.). Obviously, the phosphor is thermally stable.

The phosphor should be prepared at a non-oxygen environment such as a glove box, but the preparation steps are easy and lend themselves to mass production. Therefore, the phosphor is capable of being commercialized for application in an illumination device.

Referring to FIG. 5A, because the excitation peak of the phosphor 540 belongs to a green light L21 (515 nm to 535 nm), an excitation light source 520 having an emission peak of 515 nm to 535 nm can be collocated with the phosphor 540 to complete an illumination device 500A. In this embodiment, the excitation light source 520 emits a green light L11 (with an emission peak of 515 nm to 535 nm) to excite the phosphor 540, and the phosphor 540 is excited to emit a yellow light (with an emission peak of 560 nm to 580 nm) and a red light (with an emission peak of 610 nm to 630 nm). In some embodiment, a difference between the emission peak of the yellow light and the emission peak of the red light is greater than 50 nm. In one embodiment, referring to FIG. 5B, the illumination device 500B may further include a blue light source 522 (with an emission peak of 410 nm to 480 nm) to serve as a white light illumination device. Therefore, the blue light L12 emitted by the blue light source 522, the green light L11 emitted by the excitation light source 520, and the yellow light and the red light emitted L21 by the phosphor 540 are mixed to form a white light with an excellent color render index for a white light illumination device.

On the other hand, referring to FIG. 5C, the phosphor 540 can be mixed with a green wavelength conversion material 542, and then distributed in an optical glue. The green wavelength conversion material 542 has an excitation peak of 300 nm to 500 nm and an emission peak of 515 nm to 550 nm. For example, the green wavelength conversion material 542 can be excited by UV L13 (with a peak range from 300 nm to 400 nm). The green wavelength conversion material 542 is excited by UV L13 emitted by a UV LED 524 (with an emission peak of 300 nm to 400 nm) to emit a green light L23 (with a peak of 515 nm to 535 nm). The phosphor 540 is then excited by the green light L23 to emit a yellow light (with an emission peak of 560 nm to 580 nm) and a red light L21 (with an emission peak of 610 nm to 630 nm). In one embodiment, the green wavelength conversion material 542 can be phosphor (e.g. $Lu_3Al_5O_{12}$:Ce, β-SiAlON:Eu, or the like) or nano-size semiconductor (e.g. quantum dot material).

Figure 5D:
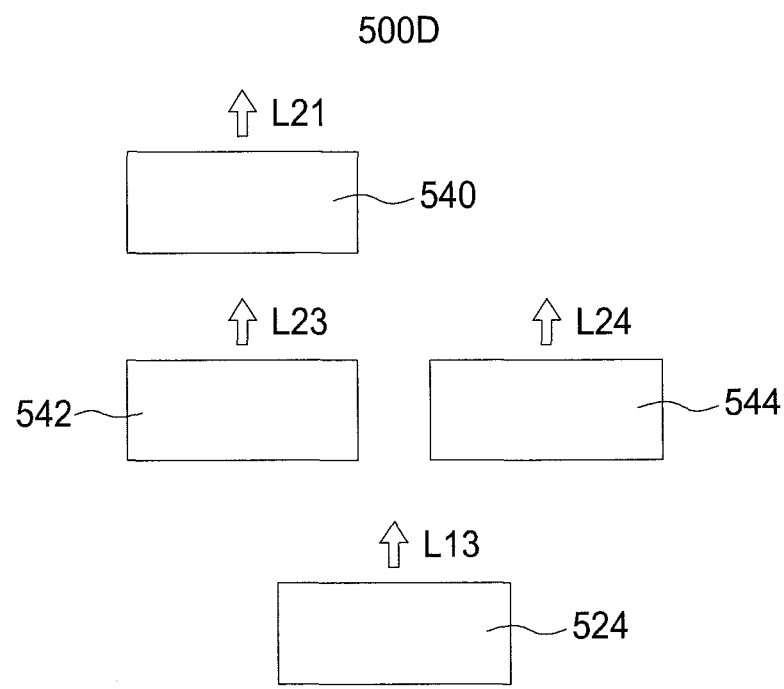

In one embodiment, referring to FIG. 5D, the green wavelength conversion material 542 (can be excited by UV), the blue wavelength conversion material 544 (can be excited by UV), and the phosphor 540 ($Sr_{1-x}LiAl_3N_4$:$Ce^{3+}_x$) are mixed and then distributed in an optical glue. The blue wavelength conversion material 544 has an excitation peak of 300 nm to 400 nm and an emission peak of 410 nm to 480 nm. The green wavelength conversion material 542 has an excitation peak of 300 nm and an emission peak of 515 nm to 550 nm. The green wavelength conversion material 542 and the blue wavelength conversion material 544 are excited by UV L13 emitted by a UV LED 524 (with an emission peak of 300 nm to 400 nm) to emit a green light L23 (with a peak of 515 nm to 550 nm) and a blue light L24 (with a peak of 410 nm to 480 nm), respectively. The phosphor 540 ($Sr_{1-x}LiAl_3N_4$:$Ce^{3+}_x$) is then excited by the green light L23 to emit a yellow light (with an emission peak of 560 nm to 580 nm) and a red light L21 (with an emission peak of 610 nm to 630 nm). Therefore, the blue light L24 emitted by the blue wavelength conversion material 544, the green light L23 emitted by the green wavelength conversion material 542, and the yellow light and the red light L21 emitted by the phosphor 540 are mixed to form a white light with an excellent color render index for a white light illumination device 500D. In one embodiment, the blue wavelength conversion material 544 can be phosphor or nano-size semiconductor (e.g. quantum dot material).

In one embodiment, the green wavelength conversion material (can be excited by a blue light), the blue wavelength conversion material (can be excited by UV), and the phosphor ($Sr_{1-x}LiAl_3N_4$:$Ce^{3+}_x$) are mixed and then distributed in an optical glue. The blue wavelength conversion material has an excitation peak of 300 nm to 400 nm and an emission peak of 410 nm to 480 nm. The green wavelength conversion material has an excitation peak of 410 nm to 480 nm and an emission peak of 515 nm to 550 nm. The blue wavelength conversion material is excited by UV emitted by a UV LED (with an emission peak of 300 nm to 400 nm) to emit a blue light (with a peak of 410 nm to 480 nm). The green wavelength conversion material is then excited by the blue light to emit a green light (with a peak of 515 nm to 550 nm). The phosphor ($Sr_{1-x}LiAl_3N_4$:$Ce^{3+}_x$) is then excited by the green light to emit a yellow light (with an emission peak of 560 nm to 580 nm) and a red light (with an emission peak of 610 nm to 630 nm). Therefore, the blue light emitted by the blue wavelength conversion material, the green light emitted by the green wavelength conversion material, and the yellow light and the red light emitted by the phosphor are mixed to form a white light with an excellent color render index for a white light illumination device. Note that if the UV is selected as the excitation light source, a UV filter should be disposed outside the illumination device to prevent damaging user eye.

Figure 5E:
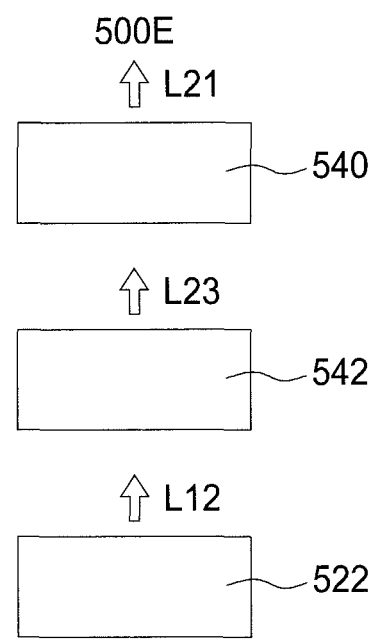

In one embodiment, referring to FIG. 5E, the green wavelength conversion material 542 can be excited by a blue light L12 (with a peak of 410 nm to 480 nm). As such, the green wavelength conversion material 542 can be directly excited by a blue light source 522 (e.g. a blue LED with an emission peak of 410 nm to 480 nm) to emit a green light L23 (with an emission peak of 515 nm to 550 nm). The phosphor 540 ($Sr_{1-x}LiAl_3N_4$:$Ce^{3+}_x$) is then excited by the green light L23 to emit a yellow light (with an emission peak of 560 nm to 580 nm) and a red light L21 (with an emission peak of 610 nm to 630 nm). Therefore, the blue light L12 emitted by the excitation blue light source 522, the green light L23 emitted by the green wavelength conversion material 542, and the yellow light and the red light L21 emitted by the phosphor 540 are mixed to form a white light with an excellent color render index for a white light illumination device 500E. The excitation light source can be an LED, a laser diode, or another suitable light emitting device.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

In following Examples, $Sr_3N_2$ was commercially available from Advanced Chemicals (99.8%, 60 mesh), $Li_3N$ was commercially available from Advanced Chemicals (99.5%, 60 mesh), AlN was commercially available from Advanced Chemicals (99%, 200 mesh), and CeN was commercially available from Materion (99.9%, 325 mesh). The gas pressure sintering furnace was High Multi 5000 (Model: FVPHP-R-5, FRET-20) commercially available from Five Power Electric Machinery Mfg. Co. Ltd., Taiwan (Serial No. 610120). X-ray diffraction (XRD) spectra of the sample powders were measured by D2-Phaser A26-X1-A2B0B2A desktop diffractometer commercially available from Bruker AXS (Serial No. 205888). Excitation spectra and emission spectra of the sample powders were measured by Fluoromax®-3 commercially available from Horiba (Jobin Yvon). The curve integration between 530 nm to 700 nm of the emission spectrum of one sample powder at 25° C. was set as 100%. The curve integrations between 540 nm to 750 nm of the emission spectrum of the sample powder at different temperatures were divided by the curve integration between 530 nm to 700 nm of the emission spectrum of one sample powder at 25° C., thereby obtaining the relative emission intensities of the sample powder at different temperatures.

Comparative Example 1

(SrLiAl$_3$N$_4$)

Sr$_3$N$_2$, Li$_3$N, and AlN were stoichiometrically weighed in a glove box at <0.1 ppm O$_2$, <0.1 ppm H$_2$O (MBraun, LABstar, M. Braun Inertgas-Systeme GmbH, Germany, Serial No. U217), ground and mixed by a mortar for 20 minutes, and then put into the gas pressure sintering furnace to be sintered under nitrogen of 0.9 MPa at 1100° C. for 4 hours. The sintered result was cooled to room temperature to obtain SrLiAl$_3$N$_4$, which was ground by a mortar to obtain a powder. The XRD spectrum of the powder is shown in FIG. 1, which does not have photoluminescent properties.

Example 1

(Sr$_{0.995}$LiAl$_3$N$_4$:Ce$^{3+}_{0.005}$)

Figure 2:
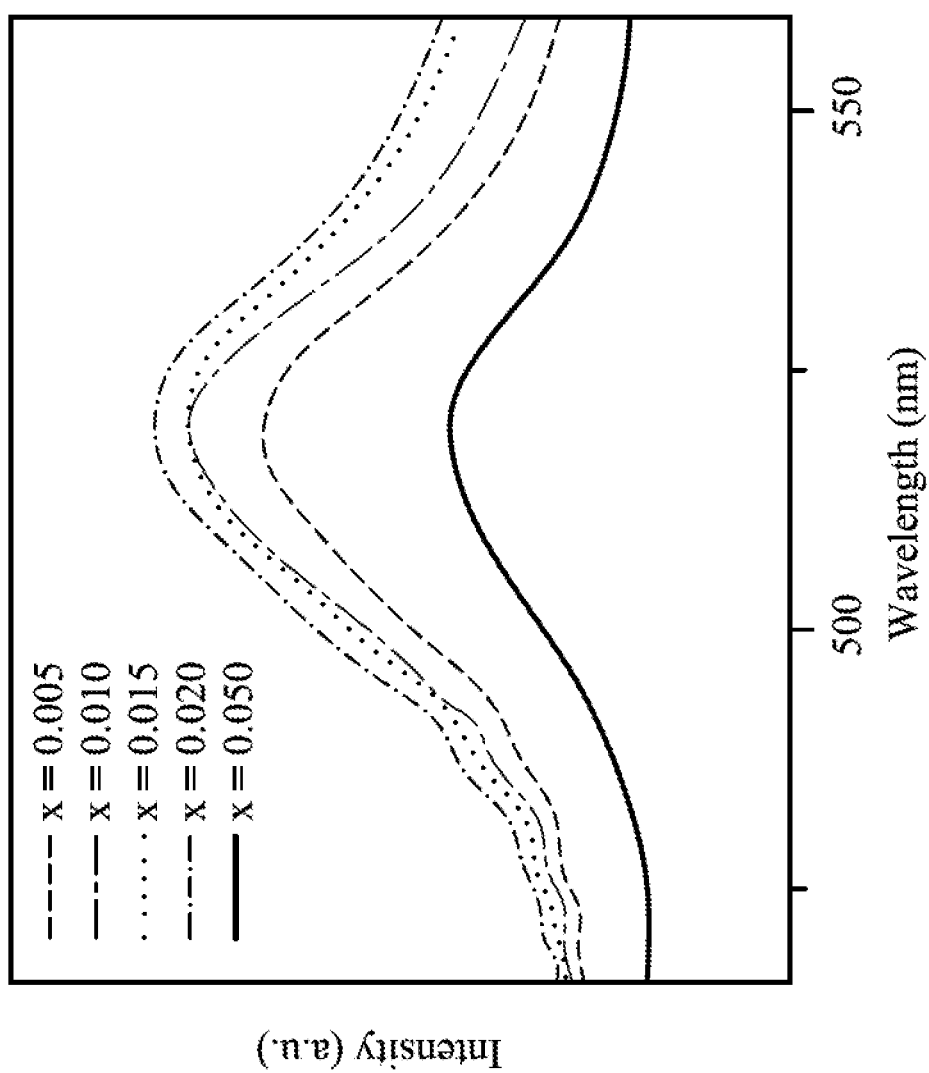
FIG. 2 shows excitation spectra of the different phosphor powders in embodiments of the disclosure.
Figure 3:
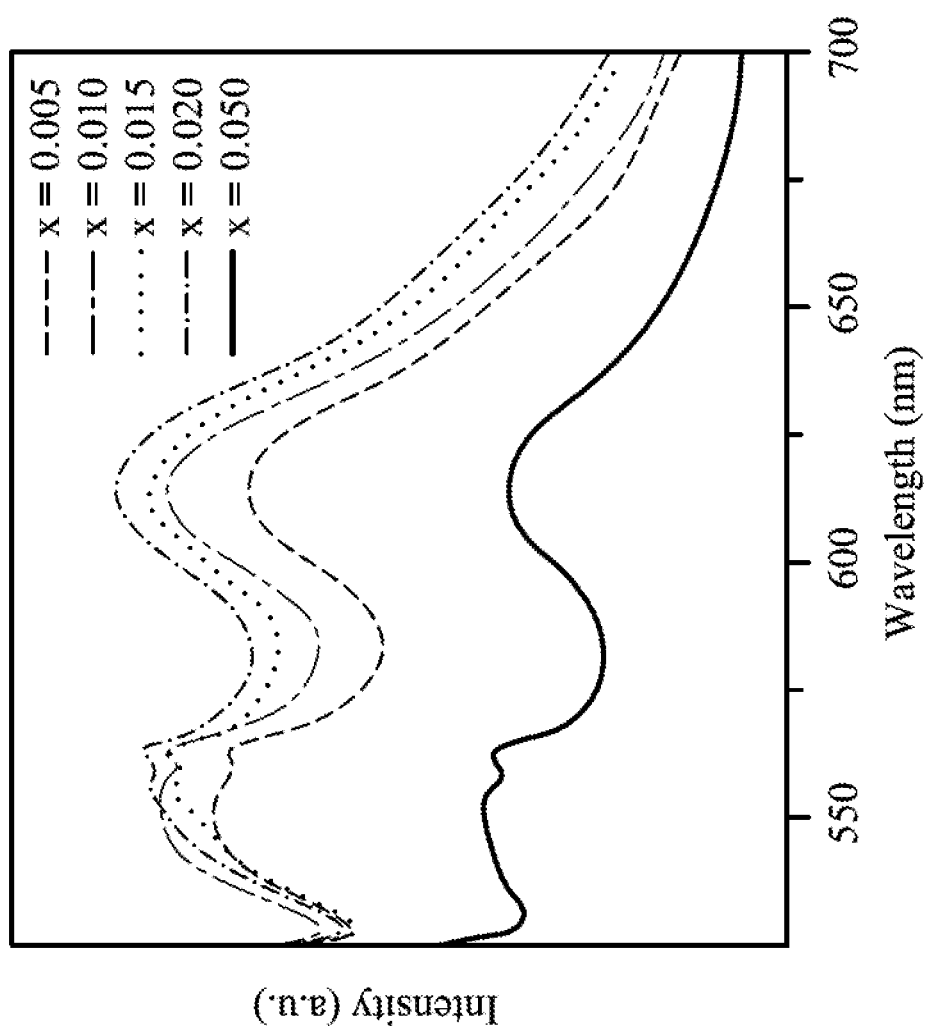
FIG. 3 shows emission spectra of the different phosphor powders in embodiments of the disclosure.

Sr$_3$N$_2$, Li$_3$N, AlN, and CeN were stoichiometrically weighed in a glove box at <0.1 ppm O$_2$, <0.1 ppm H$_2$O (MBraun, LABstar, M. Braun Inertgas-Systeme GmbH, Germany, Serial No. U217), ground and mixed by a mortar for 20 minutes, and then put into the gas pressure sintering furnace to be sintered under nitrogen of 0.9 MPa at 1100° C. for 4 hours. The sintered result was cooled to room temperature to obtain a phosphor Sr$_{0.995}$LiAl$_3$N$_4$:Ce$^{3+}_{0.005}$, which was ground by a mortar to obtain a powder. The XRD spectrum of the phosphor is shown in FIG. 1, the excitation spectrum of the phosphor is shown in FIG. 2, the emission spectrum of the phosphor is shown in FIG. 3, and the relative emission intensities of the phosphor at different temperatures were shown in FIG. 4.

Example 2

(Sr$_{0.99}$LiAl$_3$N$_4$:Ce$^{3+}_{0.01}$)

Example 2 was similar to Example 1, and the difference in Example 2 was the x value being changed from 0.005 to 0.01. The amounts of the other reactants and the steps in Example 2 were similar to those in Example 1. The XRD spectrum of the phosphor (Sr$_{0.99}$LiAl$_3$N$_4$:Ce$^{3+}_{0.01}$) is shown in FIG. 1, the excitation spectrum of the phosphor is shown in FIG. 2, the emission spectrum of the phosphor is shown in FIG. 3, and the relative emission intensities of the phosphor at different temperatures were shown in FIG. 4.

Example 3

(Sr$_{0.985}$LiAl$_3$N$_4$:Ce$^{3+}_{0.015}$)

Example 3 was similar to Example 1, and the difference in Example 3 was the x value being changed from 0.005 to 0.015. The amounts of the other reactants and the steps in Example 3 were similar to those in Example 1. The XRD spectrum of the phosphor (Sr$_{0.985}$LiAl$_3$N$_4$:Ce$^{3+}_{0.015}$) is shown in FIG. 1, the excitation spectrum of the phosphor is shown in FIG. 2, the emission spectrum of the phosphor is shown in FIG. 3, and the relative emission intensities of the phosphor at different temperatures were shown in FIG. 4.

Example 4

(Sr$_{0.98}$LiAl$_3$N$_4$:Ce$^{3+}_{0.02}$)

Example 4 was similar to Example 1, and the difference in Example 4 was the x value being changed from 0.005 to 0.02. The amounts of the other reactants and the steps in Example 4 were similar to those in Example 1. The XRD spectrum of the phosphor (Sr$_{0.98}$LiAl$_3$N$_4$:Ce$^{3+}_{0.02}$) is shown in FIG. 1, the excitation spectrum of the phosphor is shown in FIG. 2, the emission spectrum of the phosphor is shown in FIG. 3, and the relative emission intensities of the phosphor at different temperatures were shown in FIG. 4.

Example 5

(Sr$_{0.95}$LiAl$_3$N$_4$:Ce$^{3+}_{0.05}$)

Example 5 was similar to Example 1, and the difference in Example 5 was the x value being changed from 0.005 to 0.05. The amounts of the other reactants and the steps in Example 5 were similar to those in Example 1. The XRD spectrum of the phosphor (Sr$_{0.95}$LiAl$_3$N$_4$:Ce$^{3+}_{0.05}$) is shown in FIG. 1, the excitation spectrum of the phosphor is shown in FIG. 2, and the emission spectrum of the phosphor is shown in FIG. 3.

As shown in FIG. 1, the XRD spectra of the phosphors in Examples 1 to 5 have similar signals, and it means that the phosphors doped with different amounts of Ce$^{3+}$ have similar lattice structures.

As shown in FIG. 2, the phosphors in Examples 1 to 5 have excitation peaks of 515 nm to 535 nm. As shown in FIG. 3, the phosphors in Examples 1 to 5 have first emission peaks of 560 nm to 580 nm and second emission peaks of 610 nm to 630 nm. Accordingly, the phosphors have double emission peaks.

Figure 4:
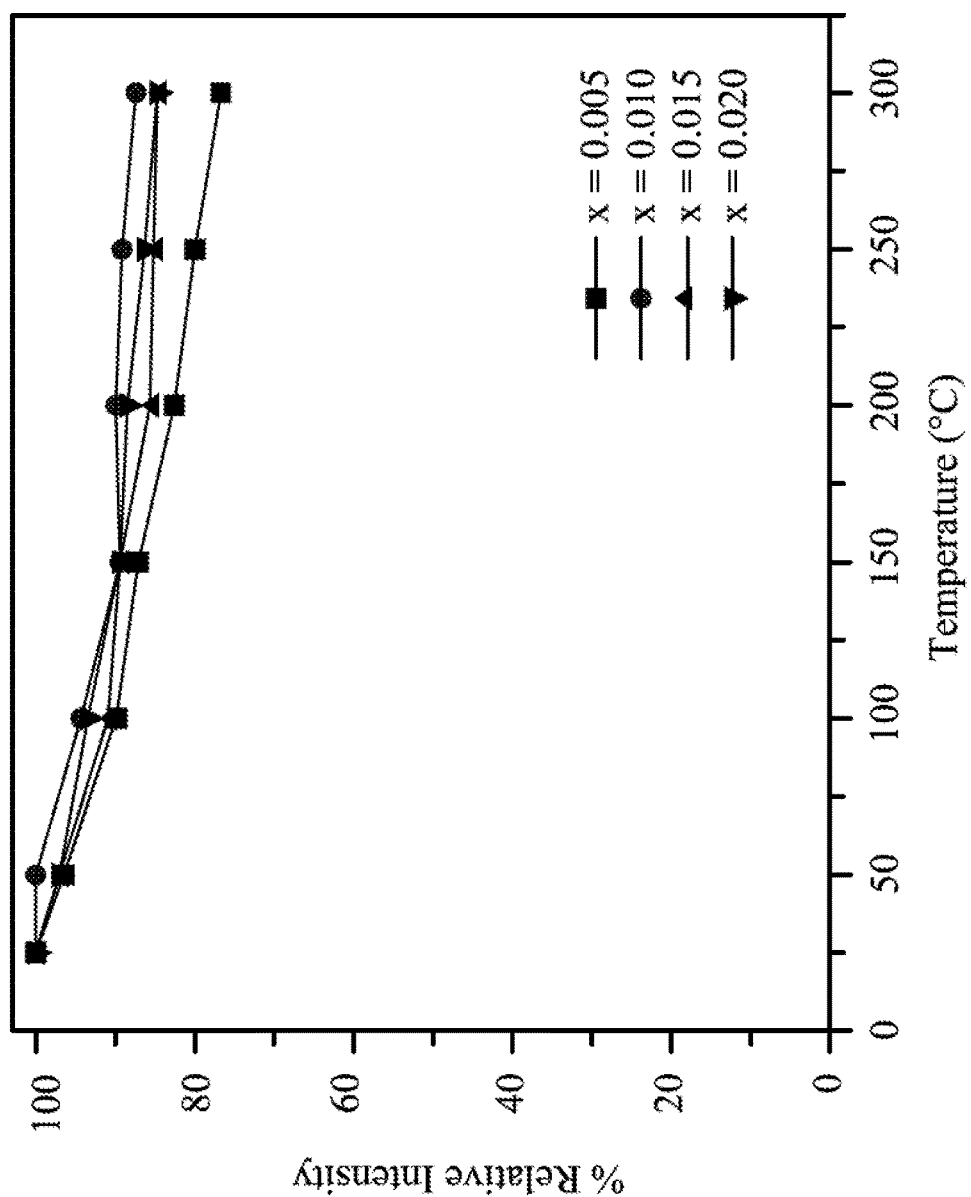
FIG. 4 shows relative emission intensities of the different phosphor powders at different temperatures in embodiments of the disclosure.

As shown in FIG. 4, the phosphors at high temperature (e.g. 300° C.) have relative emission intensities of greater than about 80% (on the basis of emission intensity of the phosphors at 25° C.). Obviously, the phosphors were thermally stable.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phosphor, having a composition of Sr$_{1-x}$LiAl$_3$N$_4$:Ce$^{3+}_x$,
    wherein 0<x<0.1, and
    wherein the phosphor has an excitation peak of 515 nm to 535 nm, a first emission peak of 560 nm to 580 nm, and a second emission peak of 610 nm to 630 nm.

2. The phosphor as claimed in claim 1, wherein 0.01≤x≤0.02.

3. The phosphor as claimed in claim 1, wherein a difference between the first emission peak and the second emission peak is greater than 50 nm.

4. An illumination device, comprising:
the phosphor as claimed in claim 1; and
a first light source.

5. The illumination device as claimed in claim 1, wherein the first light source is operable to emit a green light with an emission peak of 515 nm to 550 nm.

6. The illumination device as claimed in claim 5, further comprising a second light source with an emission peak of 410 nm to 480 nm,
   wherein the illumination device is operable to emit a white light.

7. The illumination device as claimed in claim 4, further comprising a green wavelength conversion material with an excitation peak of 300 nm to 500 nm and an emission peak of 515 nm to 550 nm.

8. The illumination device as claimed in claim 7, wherein the first light source is a UV LED with an emission peak of 300 nm to 400 nm.

9. The illumination device as claimed in claim 8, further comprising a blue wavelength conversion material which is capable to be excited by the first light source and has an excitation peak of 300 nm to 400 nm and an emission peak of 410 nm to 480 nm.

10. The illumination device as claimed in claim 9, wherein the illumination device is operable to emit a white light.

11. The illumination device as claimed in claim 7, wherein the first light source is a blue LED with an emission peak of 410 nm to 480 nm.

12. The illumination device as claimed in claim 11, wherein the illumination device is operable to emit a white light.

\* \* \* \* \*